United States Patent
Scarpulla (10) Patent No.: US 7,071,862 B1
(45) Date of Patent: Jul. 4, 2006

(54) TRANSMISSION LINE ANALOG TO DIGITAL CONVERTER

(75) Inventor: John R. Scarpulla, Rancho Palos Verdes, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 11/151,183

(22) Filed: Jun. 10, 2005

(51) Int. Cl.
*H03M 1/12* (2006.01)

(52) U.S. Cl. ............... 341/155; 341/167; 341/170
(58) Field of Classification Search ............ 341/155, 341/133, 138, 167, 170
See application file for complete search history.

(56) References Cited

U.S. PATENT DOCUMENTS

| | | | | | |
|---|---|---|---|---|---|
| 4,143,363 | A | * | 3/1979 | Dotter, Jr. | 341/138 |
| 5,835,420 | A | * | 11/1998 | Lee et al. | 365/189.09 |
| 6,229,468 | B1 | * | 5/2001 | Broekaert | 341/133 |
| 6,608,581 | B1 | * | 8/2003 | Semenov | 341/155 |

\* cited by examiner

*Primary Examiner*—Jean Bruner Jeanglaude
(74) *Attorney, Agent, or Firm*—Derrick Michael Reid

(57) ABSTRACT

A transmission line analog-to-digital converter uses an unterminated transmission line driven by a current source to generate a stair-step waveform having equal time step periods for measuring the conversion time as a digital output value of an analog input. The converter has the advantages of simplicity, accuracy, high speed, low transistor count, and low power consumption. Fast successive approximation converters can be used for improved speed and accuracy of digital conversion of analog signals.

19 Claims, 6 Drawing Sheets

DOUBLE CONVERSION TRANSMISSION LINE
ANALOG-TO-DIGITAL CONVERTER

TRANSMISSION LINE ANALOG-TO-DIGITAL CONVERTER

FIG. 1

DOUBLE CONVERSION TRANSMISSION LINE
ANALOG-TO-DIGITAL CONVERTER

FIG. 2

TRANSMISSION LINE ANALOG-TO-DIGITAL
CONVERTER TIMING DIAGRAM

FIG. 3

SUCCESSIVE MUX TRANSMISSION LINE
ANALOG-TO-DIGITAL CONVERTER

FIG. 4

SUCCESSIVE BYTE TRANSMISSION LINE
ANALOG-TO-DIGITAL CONVERTER

TRANSMISSION LINE ANALOG TO DIGITAL CONVERTER

STATEMENT OF GOVERNMENT INTEREST

The invention was made with Government support under contract No. F04701-00-C-0009 by the Department of the Air Force. The Government has certain rights in the invention.

FIELD OF THE INVENTION

The invention relates to the field of analog to digital conversion circuits and transmission lines. More particularly, the present invention is related to analog to digital converters using transmission lines for providing stair-step signals for converting analog input signals to digital signals.

BACKGROUND OF THE INVENTION

The analog-to-digital converter (ADC) is a ubiquitous component in modern electronics and satellite systems. The tradeoff has traditionally been between the speed of conversion, the number of bits and the power consumption. The ADC samples an analog input that is then quantized by a quantizer that can be implemented in a number of ways. A flash converter uses a resistive divider to obtain the quantization. While very fast, the flash converter is limited to a small number of bits of resolution because of size and power constraints. In a successive approximation ADC, a digital approximation of the analog voltage is first obtained with low resolution. Then an internal digital to analog converter generates an analog approximation, which is compared against the input signal to obtain a residual. The residual is then amplified and digitized in a second step to obtain more bits of precision. The successive approximation ADC is slow and requires complex circuitry, including a complete internal digital-to-analog converter. A sigma-delta ADC uses a single comparator in a feedback loop. The sigma-delta ADC has a very high clock rate. The comparator samples the input signal and compares it against a reference value derived from integration of previous samples. The result is a string of binary numbers whose density represents the analog voltage. With additional digital signal processing, this string can be reconstructed into a high-resolution digital signal. The tradeoff is that the high resolution comes at the expense of speed. These conventional ADCs are complex circuits having high power requirements. These and other disadvantages are solved or reduced using the invention.

SUMMARY OF THE INVENTION

An object of the invention is to provide an analog to digital converter (ADC) having a transmission line for creating a stair-step signal used for quantizing an analog input into a digital output.

Another object of the invention is to provide a transmission line ADC that accurately quantizes an analog input into a digital output.

Yet another object of the invention is to provide an ADC having a transmission line driven by a current source for creating a stair-step signal used for quantizing an analog input.

Still another object of the invention is to provide an ADC having a transmission line driven by a current source for creating a stair-step signal that is compared to an analog input for digitizing an analog input.

The invention is directed to an ADC having a transmission line that is driven by one or more current sources for providing a stair-step signal that is compared to an analog input for quantizing the analog signal into a digital signal. The transmission line is preferably an unterminated transmission line driven by a current source to generate the stair-step waveform for quantizing the analog input. The transmission line ADC stair-steps are compared to a sampled analog input with each stair-step having a predetermined time duration so that a clock can be used to increment a counter that is latched when the stair-step signal exceeds that analog input for providing a digital value. The value of the counter is a digital quantization of the sampled analog input.

The transmission line ADC offers simplicity, accuracy, high speed, low transistor count, and low power consumption. The reflection signal properties of an unterminated transmission line enables quantization of the analog signal. The transmission line is used to generate an accurate stair-step waveform that is electronically compared to the analog input signal. The timing of the stair-step waveform is known accurately because the timing is determined by the length of the transmission line. A quantization is achieved by the timing of the output of a simple electronic comparator. The transmission line ADC can be scaled to very high speeds. Successive approximation transmission line ADCs can also be implemented without an increase in circuit complexity. These and other advantages will become more apparent from the following detailed description of the preferred embodiment.

DETAILED DESCRIPTION OF THE PREFERRED EMBODIMENT

Figure 1:
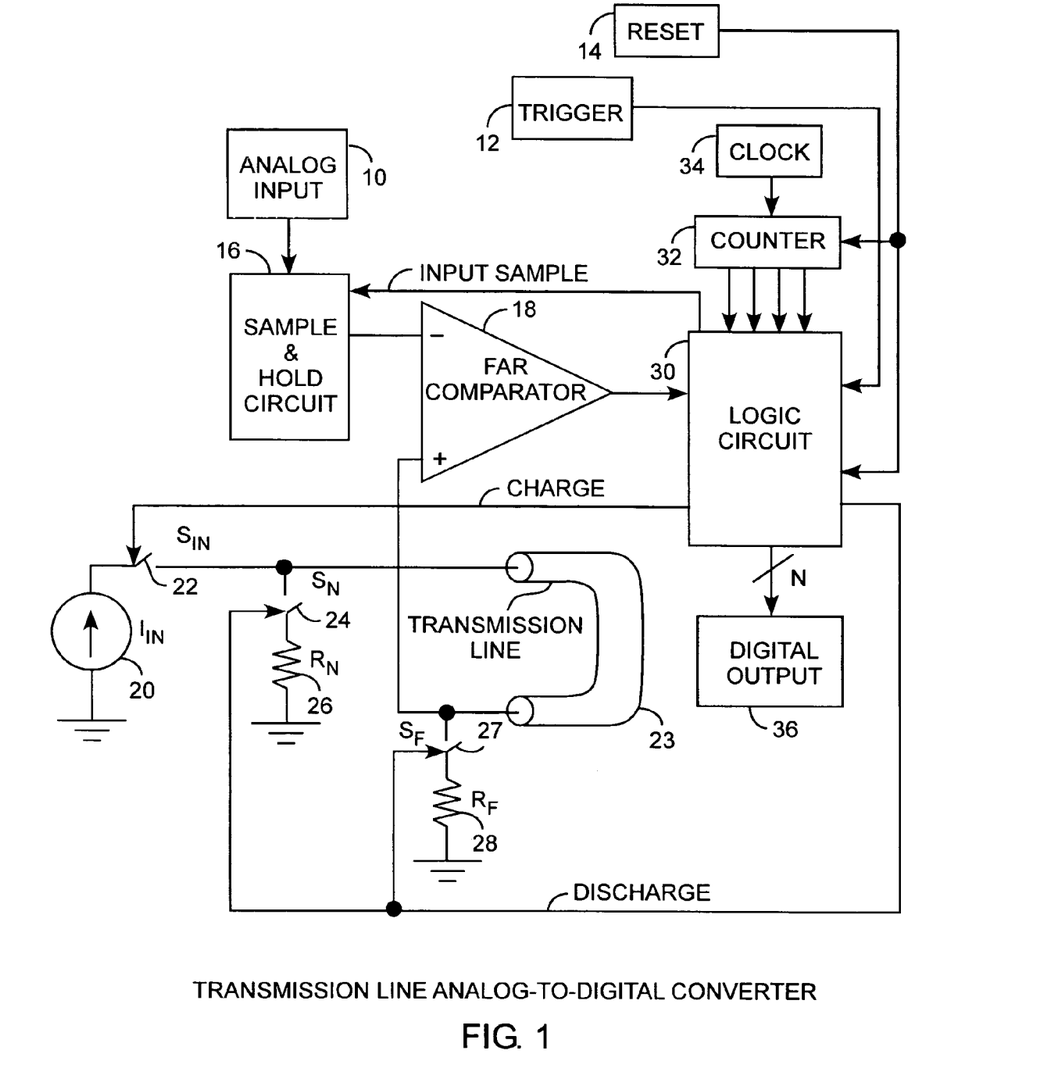
FIG. 1 is a block diagram of a transmission line digital to analog converter.

An embodiment of the invention is described with reference to the figures using reference designations as shown in the figures. Referring to FIG. 1, an analog-to-digital converter (ADC) receives an analog input 10 that is sampled at a trigger time by a trigger signal 12. The trigger signal 12 is sent to a logic circuit 30 which then issues an input sample signal for activating a sample and hold circuit 16 for providing a sampled analog signal to a far comparator 18 at the far end of the transmission line. The trigger 12 starts the conversion whereas a reset signal 14 enables reset of the analog-to-digital conversion (ADC) after each conversion. An $I_{IN}$ input current source 20 provides an $I_{IN}$ input current to the near end of the transmission line 23 through an $S_{IN}$ input switch 22 that is closed upon the charge signal from a logic circuit 30. The generation of the waveform is based on the current source 20 being switched onto the near end of an ideal transmission line, so that, a stair-step waveform is generated at the far end of the transmission line 23. After a conversion, the $S_{IN}$ switch is opened by the deactivation of the charge signal by the logic circuit 30 for terminating the generation of the stair-step signal. A $S_N$ near switch 24 having a $R_N$ near resistor 26 and a $S_F$ far switch 27 having a $R_F$ far resistor 28 are closed by the discharge signal from the logic circuit 30, so that the transmission line 23 is terminated through the resistors 26 and 28 to discharge to ground the transmission line 23 at the end of the conversion. A near terminal of the transmission line 23 is connected to the input current source 20 and a far terminal of the transmission line 23 is connected to a high impedance input of the far comparator 18. The stair-step signal communicated to the far comparator 18 is generated during a stair-stepping period after the occurrence of the trigger 12. As the stair-step signal increases during the stair-stepping period, the stair-step signal crosses and exceeds the sampled analog signal from the sample and hold circuit 16, at which time, the far comparator 18 toggles for communicating a quantization signal to a logic circuit 30. The logic circuit 30 can be used to perform combinatory logic for controller operation of the ADC, for example, by receiving the trigger 12 and issuing a sample signal to the sample and hold circuit 16, by issuing a charge signal to the $S_{IN}$ switch 22 to start the generation of the stair-step signal, and by issuing a discharge signal to the switches $S_N$ and $S_F$ to discharge the transmission line at the end of the conversion in order to be ready for the next conversion. The logic 30 can also control the reset operation of the ADC. During the stair-stepping period, a counter 32 is clocked and repetitively incremented by a clock 34. The reset 14 could be fed into the logic circuit 30 for resetting the counter so that it is ready for the next conversion. The clock 34 has the same period as the stair-step signal. Hence, after a reset, the counter 32 increments in synchronism with the stepping of the stair-step signal. At the quantization time, the counter 32 feeds a digital value to the logic circuit 30 that then latches the counter value into the logic circuit 30. The counter presents the digital value as a digital output 36 having N bits. After presenting the digital output 36, the reset signal 14 resets the counter 32, the logic circuit 30, as well as terminating the transmission line 23 through switches 24 and 27, and resistors 26 and 28. The digital output 36 is a digital value of the analog input 10 by virtue of relating the counter period to the stair-stepping period as the stair-step signal stair-steps to and exceeds the sampled analog input at the time quantization.

The transmission line 23 has a length L and has a velocity of propagation v. The characteristic transit time of the line is L/v and is equal to the clock period 34. Initially, the transmission line 23 is deenergized. At time t=0, when the trigger 12 is received, an input sample signal is issued by the logic circuit 30, and the sample and hold circuit 16 captures the analog input signal 10 as the sampled analog input. Simultaneously, a charge signal is issued by the logic circuit and the $I_{IN}$ input current source 20 is switched onto the transmission line 23. At a time L/v later, a transmission line signal propagates from the near end to the far end of the transmission line 23, and the voltage at the far end becomes $2V_0$, where $V_0=I_{IN}Z_0$ where $Z_0$ is the characteristic impedance of the transmission line. Because the far end is unterminated, a reflection occurs that propagates back to the near end of the transmission line 23, where the reflection reflects again, and returns to the far end for producing a voltage $4V_0$ at the a time 3L/v. In like fashion, the voltage at the far end steps up by $2V_0$ at the times kL/v, where k is an odd integer, thus generating the stair-step signal during the stair-stepping period. At the time of the trigger 12, a clock timer is effectively started using the counter 32 that is clocked at times kL/v so that the counter 32 increments with each stair-step of the stair-step signal.

With an analog input signal being $6V_0$, for example, the far end of the transmission line with stair-step $1V_0$ at time L/v, from $1V_0$ to $3V_0$ at time 3L/v, from $3V_0$ to $5V_0$ at time 5L/v, and from $5V_0$ at time 7L/v, at the quantization time. The counter 32 is clocked at end of each of the L/v periods, and hence, the counter value will be seven, as a quantized digital value of input $6V_0$. At the time of the quantization signal, the accumulated clock count of seven of the counter 32 determines the correct digital value that is then latched in the logic circuit 30 and presented as the digital output 36. The transmission line 23 can be lengthened or shorted to provide as many stair-steps per volt of the analog input signal 10 for improved resolution. As such, the ADC can be constructed with any number of bits N with $2^N$ stair-steps. This ADC has a practical transmission line design, but can be improved by utilizing both ends of the transmission line in a double conversion ADC.

Figure 2:
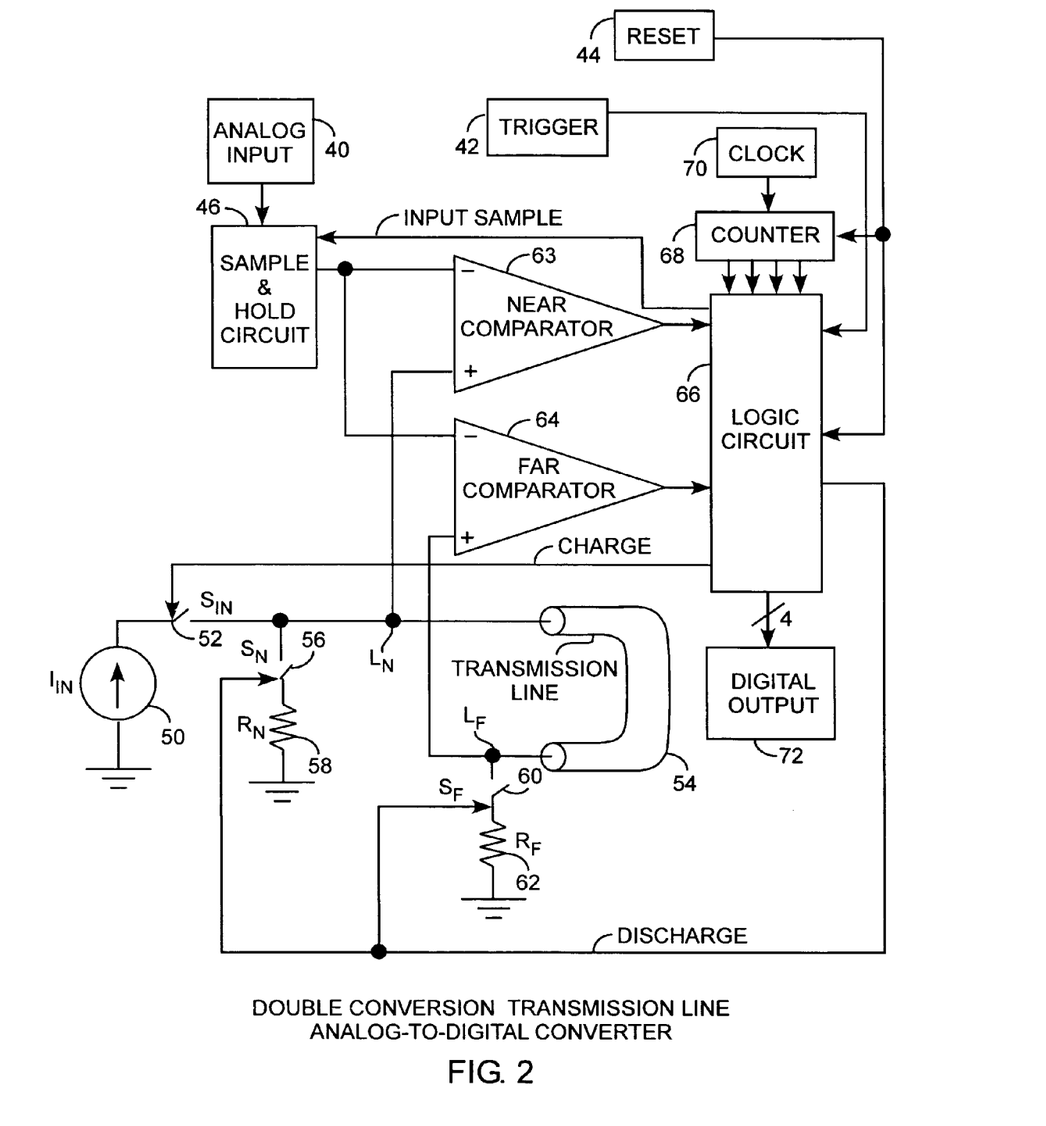
FIG. 2 is a block diagram of a double conversion transmission line digital-to-analog converter.

Referring to FIG. 2, a double conversion ADC receives an analog input 40 that is sampled at a trigger time by an input sample signal issued from the logic circuit 66 generated from an input trigger signal 42 for activating a sample and hold circuit 46 for providing a sampled analog signal. The trigger 42 starts the conversion whereas a reset signal 44 enables reset of the ADC after conversion. An $I_{IN}$ input current source 50 provides an $I_{IN}$ input current to an $S_{IN}$ input switch 52 that is closed upon receipt of the charge signal from the logic circuit 66 for feeding the $I_{IN}$ current to the near end of a transmission line 54. The ADC operation is based on the current source 50 being switched onto an ideal transmission line so that near and far stair-step waveforms are concurrently generated by the transmission line 54. After a conversion is completed, a $S_N$ near switch 56 having a $R_N$ near resistor 58 and a $S_F$ far switch 60 having a $R_F$ far resistor 62, are closed by the discharge signal from the logic circuit 66 so that the transmission line 54 is terminated through the switches 56 and 60 and resistors 58 and 62 to terminate the generation of near and far stair-step signals and to discharge to ground the transmission line 54 at time of reset 44. The sampled analog signal from the sample and hold circuit 46 is fed to a near comparator 63 and to a far comparator 64 for respectively generating near and far quantization signals to a logic circuit 66. The logic circuit 66 receives the trigger 42 and the reset 44 and issues the input sample signal for sampling the analog input 40 by the sample and hold circuit 46 while concurrently issuing the charge signal for closing the $S_{IN}$ input switch 52 to start the generation of far and near stair-step signals $L_F$ and $L_N$ at respective near and far end terminals of the transmission line 54. The near end terminal of the transmission line is driven by the current source 50. The near signal $L_N$ is fed to a high impedance input of the near comparator 63. A far signal $L_F$ of the far end of the transmission line 54 is connected to a high impedance input of the far comparator 64. The far stair-step signal $L_F$ is generated at the far terminal of the transmission line 54 and the near stair-step signal $L_N$ is generated at the near terminal of the transmission line 54. The near and far stair-step signals $L_N$ and $L_F$ are concurrently fed to the comparators 63 and 64 during a stair-stepping period after the issuance of the sample signal upon the occurrence of the trigger 42. Both the near stair-step signal $L_N$ and the far stair-step signal $L_F$ incrementally increase in voltage during the stair-stepping period, but at different stair-step values. The sampled analog signal from the sample and hold circuit 46 is electronically compared to the near stair-step signal $L_N$ by the near comparator 63 and to the far stair-step signal $L_F$ by the far comparator 64. Both the near and far comparators operate simultaneously.

Depending upon the value of the sampled analog signal from the sample and hold circuit 46, either the near comparator 63 or the far comparator 64 toggles first, communicating either a near or far quantization signal that is fed into the logic circuit 66.

During the stair-stepping period, a counter 68 is clocked and repetitively incremented by a clock 70 having an L/v period. Upon receipt of either the near or the far quantization signals from the near or far comparators, the counter 68 feeds a digital value to the logic circuit 66 that latches the counter value into the logic circuit 66 and presents the digital value as a digital output 72. After presenting the digital output 72, the reset 44 resets the counter 68, the logic circuit 66, deactivates the charge signal and opens the $S_{IN}$ switch 52, and issues the discharge signal that closes switches $S_N$ and $S_F$, 56 and 60 discharging the transmission line 54 through switches 56 and 60 and resistors 58 and 62.

Figure 3:
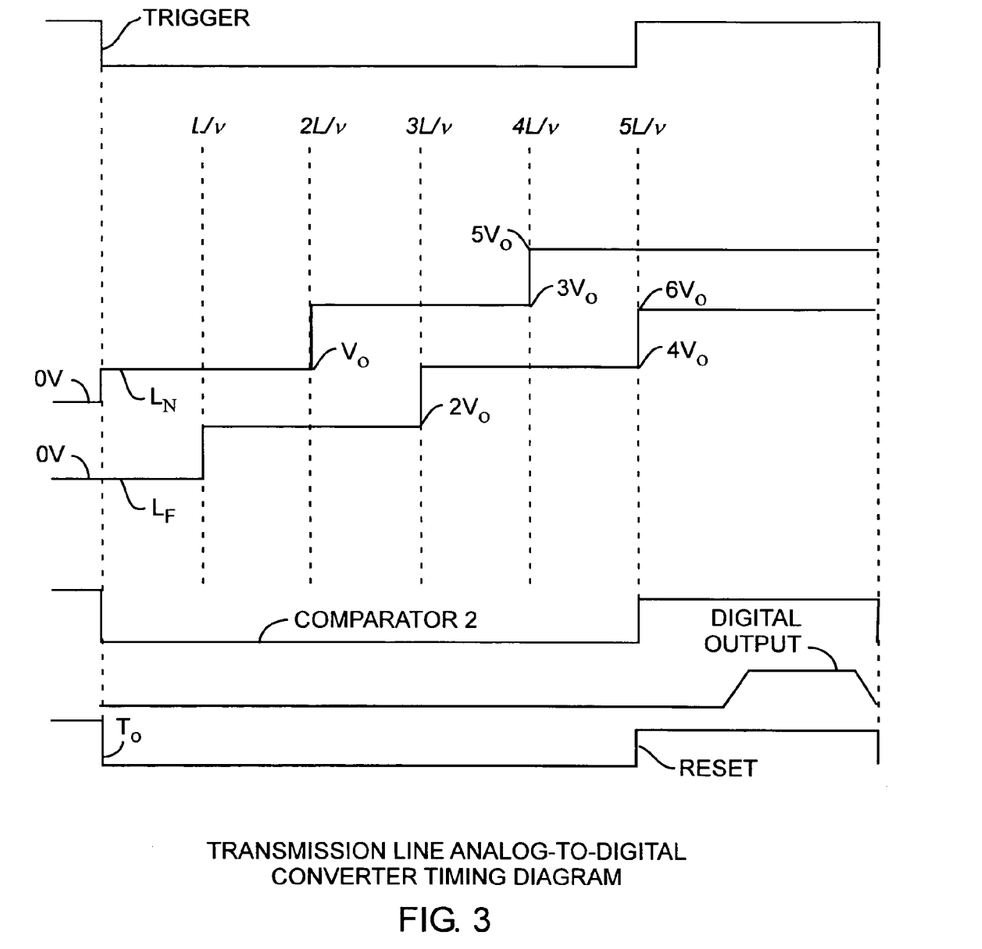
FIG. 3 is a transmission line digital-to-analog converter timing diagram.

Referring to FIGS. 2 and 3, the near $L_N$ and far $L_F$ stair-step signals at the near and far ends of the line are effectively interleaved and generated during the stair-stepping period. The near end provides odd multiples of the step height $V_0$, and the far end provides even multiples of $V_0$. Therefore, two comparators 63 and 64 are connected at respective ends of the transmission line 54 in order to reconstruct a complete staircase with each step having height $V_0$. The comparators 63 and 64 are referenced to the sampled analog signal. At the time of being triggered $T_0$, the clock 70 is started. The clock period of the clock 70 is approximately the same period as the characteristic transmission line time constant L/v.

The sampled analog signal is captured by the sample and hold circuit 46. For example, the sampled analog signal may be $5.5V_0$ that is between $5V_0$ and $6V_0$. The near signal $L_N$ is zero initially, then steps to $V_0$ at $T_0$, then steps to $3V_0$ at time 2L/v, $5V_0$ at time 4L/v, etc. The far signal $L_F$ is also at zero initially, and remains at zero at $T_o$, then steps to $2V_0$ at time L/v, steps to $4V_0$ at time 3L/v, and steps to $6V_0$ at time 5L/v, when exceeding the sampled analog input. Therefore, the far comparator 64 switches first when the logic circuit 66 latches the accumulated clock count of the counter 68. The logic circuit then presents the digital word to the digital output 72. As such, the resolution of the double conversion ADC has been increased from $2V_0$ to $1V_0$.

The clock 70 need not be a highly accurate jitter-free clock because the stair-step waveforms contain sufficient dwell time and are free from jitter. After the completion of the digitization by the logic circuit 66, the reset 44 is issued. The logic circuit then turns off the $S_{IN}$ switch 52, and temporarily closes the $S_N$ and $S_F$ switches 56 and 60 for grounding by the discharge $R_N$ and $R_F$ resistors 58 and 62 that provide a matched impedance condition, discharging the transmission line 54 in one characteristic time L/v. At this discharged point, the ADC is ready to perform the next digitization of the next analog input 40. This ADC can have several bits of resolution, for example, four or five bits of resolution. Beyond that, the number of reflections on the transmission line 54, each of which reflection are not perfectly ideal, increases as digitization accuracy degrades. However, the ADC can be modified with successive approximations to develop an accurate residual for improved digitization resolution.

Figure 4:
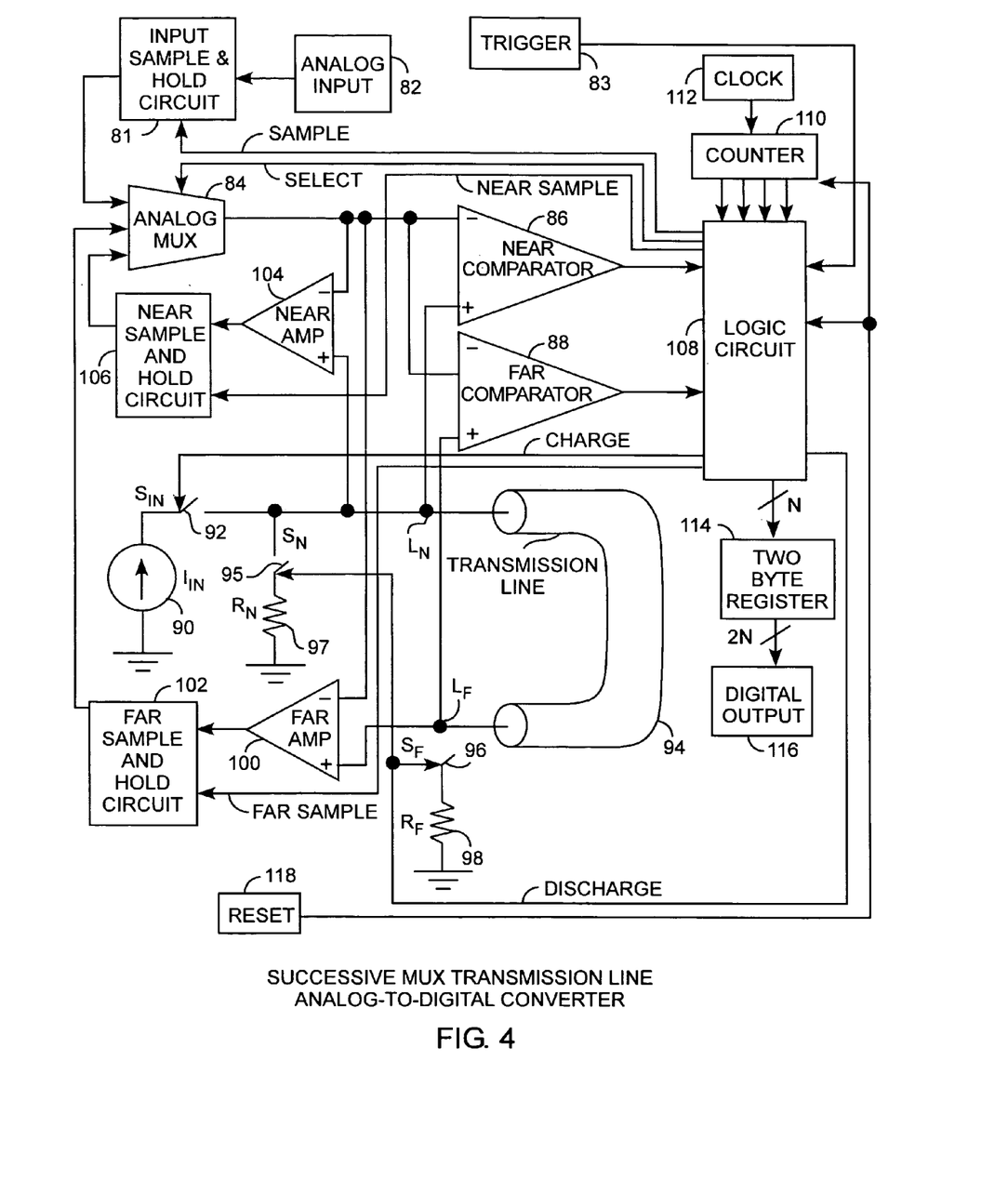
FIG. 4 is a block diagram of a successive multiplexer transmission line digital-to-analog converter.

Referring to FIG. 4, a successive multiplexed transmission line ADC receives an analog input 82 that is sampled at a trigger time upon a trigger 83 using an input sample signal. The ADC conversion cycle includes an input stair-stepping period followed by a residual stair-stepping period for respectively generating two bytes of two-byte word as a quantization of the analog input 81. During the input stair-stepping period, the logic circuit 108 controls the analog multiplexer 84 by the select signal. The input sample signal is used for activating an input sample and hold circuit 82 for sampling the analog input 81 and providing a sampled analog input signal that is fed to an analog multiplexer 84 that provides a multiplex sampled analog input signal to a near comparator 86 and to a far comparator 88. An input current source IIN 90 provides an $I_{IN}$ current to an $S_{IN}$ input switch 92 that is closed upon a charge signal for feeding the $I_{IN}$ input current to a transmission line 94. ADC operation is based on the current source 90 being switched onto the transmission line 94 so that near and far stair-step signals $L_N$ and $L_F$ are generated by the transmission line 93 at respective near and far terminals of the transmission line 94. The near and far stair-step signals have interleaved stair-stepped waveforms. When the near stair-step signal is equal to or greater than the input sample and hold level that is present at the output of the analog multiplexer 84, the near comparator 86 toggles at a near quantization time and issues a near quantization signal. When the far stair-step signal is equal to or greater than the input sample and hold level that is present at the output of the analog multiplexer 84, the far comparator 86 toggles at a far quantization time and issues a far quantization signal. Either one of the comparators 86 or 88 will toggle. When either of the near or far quantization signals from one of the comparators 86 and 88 is received at the end of the significant stair-stepping period, a residual is then sampled and held by either of the near or far sample and hold circuits 102 and 106 by sampling near and far residuals from two amplifiers 104 and 100.

Upon a near quantization time, when only the near comparator 86 toggles first, the near stair-step signal exceeds the multiplex sampled analog signal, at which point, the near sample signal from the logic circuit 108 activates near sample and hold circuit 106 for sampling a near residual. The near residual is the difference between the input sampled signal and the near stair-step signal, and is applied to the near amplifier 104 having gain $2^N$ and then sampled by the near sample and hold circuit 106. The logic circuit 108 then issues the discharge signal to open the $S_{IN}$ switch while closing the $S_N$ near switch and the $S_F$ far switch so as to discharge the transmission line 94. The logic circuit 108 then selects the near residual from the near sample and hold circuit 106. The near residual is fed through the multiplexer 84 using the select signal for providing the residual at the output of the multiplexer to the near and far comparators 86 and 88. Upon a far quantization time, when only the far comparator 88 toggles first, the far stair-step signal exceeds the multiplex sampled analog signal, at which point, the far sample signal from the logic circuit 108 activates far sample and hold circuit 100 for sampling a far residual. The far residual is the difference between the input sampled signal and the far stair-step signal and is applied to the far amplifier 100 having gain $2^N$ and then sampled by the far sample and hold circuit 102. The logic circuit 108 then deactivates the charge signal to open the $S_{IN}$ switch while also activating the discharge signal for a period L/v, closing the $S_N$ near switch and the $S_F$ far switch so as to discharge the transmission line 94 in a time L/v. The logic circuit 108 then selects the far residual from the far sample and hold circuit 102. The far residual is fed through the multiplexer 84 using the select signal for providing the far residual at the output of the multiplexer 84 to the near and far comparators 86 and 88 with the transmission line 94 being discharged. The logic circuit 108 outputs the value of the counter 110 as the most significant byte (MSB) to a two-byte register. The logic circuit issues the select signal to the analog multiplexer 84 that selects either the output of the near sample and hold circuit 106 or the far sample and hold circuit 102, determined by whichever had first issued a quantization signal. Hence, the residual is provided at the output of the analog multiplexer 84 with the transmission line 94 discharged.

The logic circuit 108 is used to start the residual stair-stepping period in a second digitization pass of the ADC. The charge signal is used to close $S_{IN}$ switch 92 while opening discharge switches 95 and 96. The near and far interleaved stair-step signals increase in increments until either the near or far comparator issue a respective residual near and far digitization signals to the logic circuit 108. Upon either of the residual near and far digitization signals, the logic circuit 108 latches in the value of the counter 110 and presents the latched counter value as a least significant byte to the two-byte register 114. The two-byte register 114 then contains the digital output 116 being a two-byte digital value of the analog input 82. The logic circuit can then discharge the transmission line 94 and await a new trigger 83 for starting the next conversion. The full digital word consisting of 2N bits is then available at the digital output 116 after two successive MSB and LSB digitization cycles. In order to prepare for the next analog-to digital conversion, a reset signal 118 is issued that resets the logic circuit 108, the two-byte register 114, and the counter 110. The reset signal also deactivates the charge signal for switching off switch $S_{IN}$ 90, and activates the discharge signal for the time period L/v for switching on near switch $S_N$ 95 and far switch $S_F$ 96 for discharging the transmission line in a time L/v. The next analog-to-digital conversion begins for the next input sample signal as the conversion process is repeated.

Figure 5:
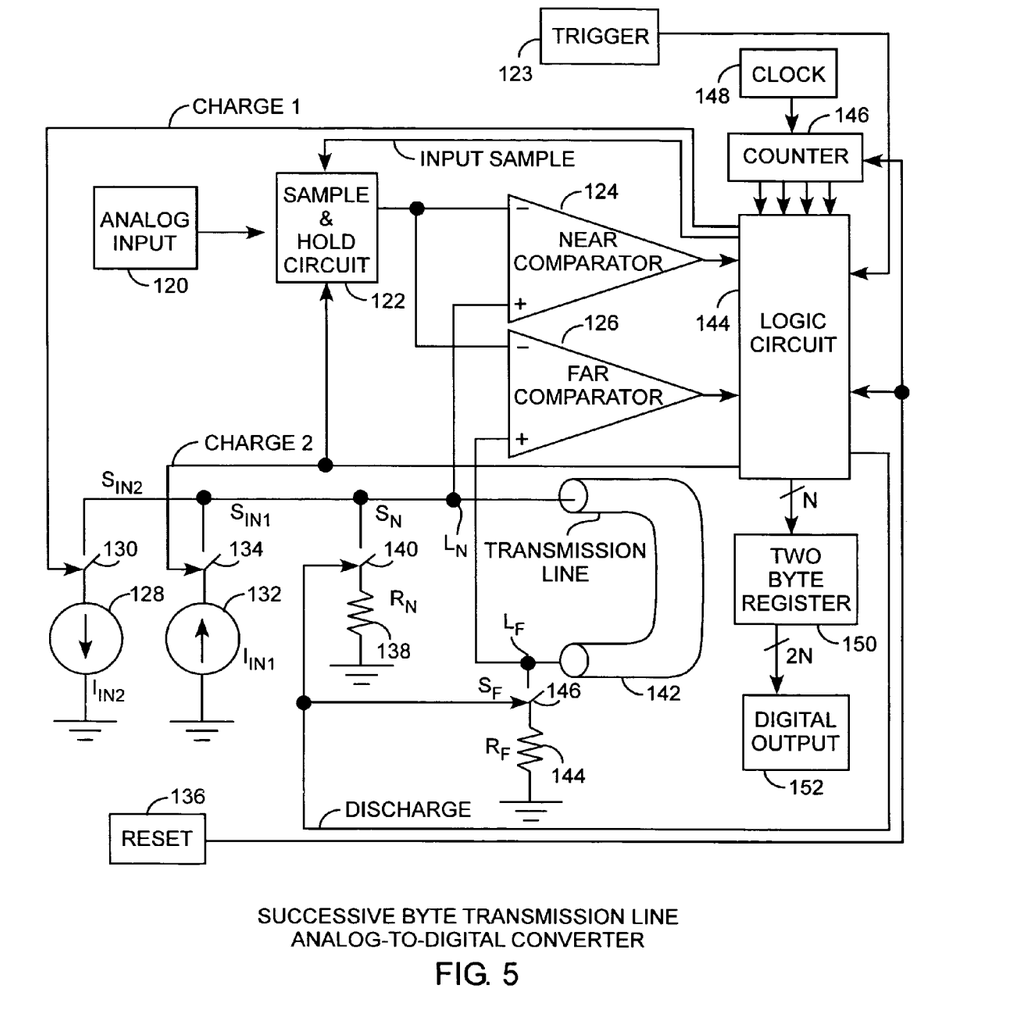
FIG. 5 is a block diagram of a successive byte transmission line digital to analog converter.
Figure 6:
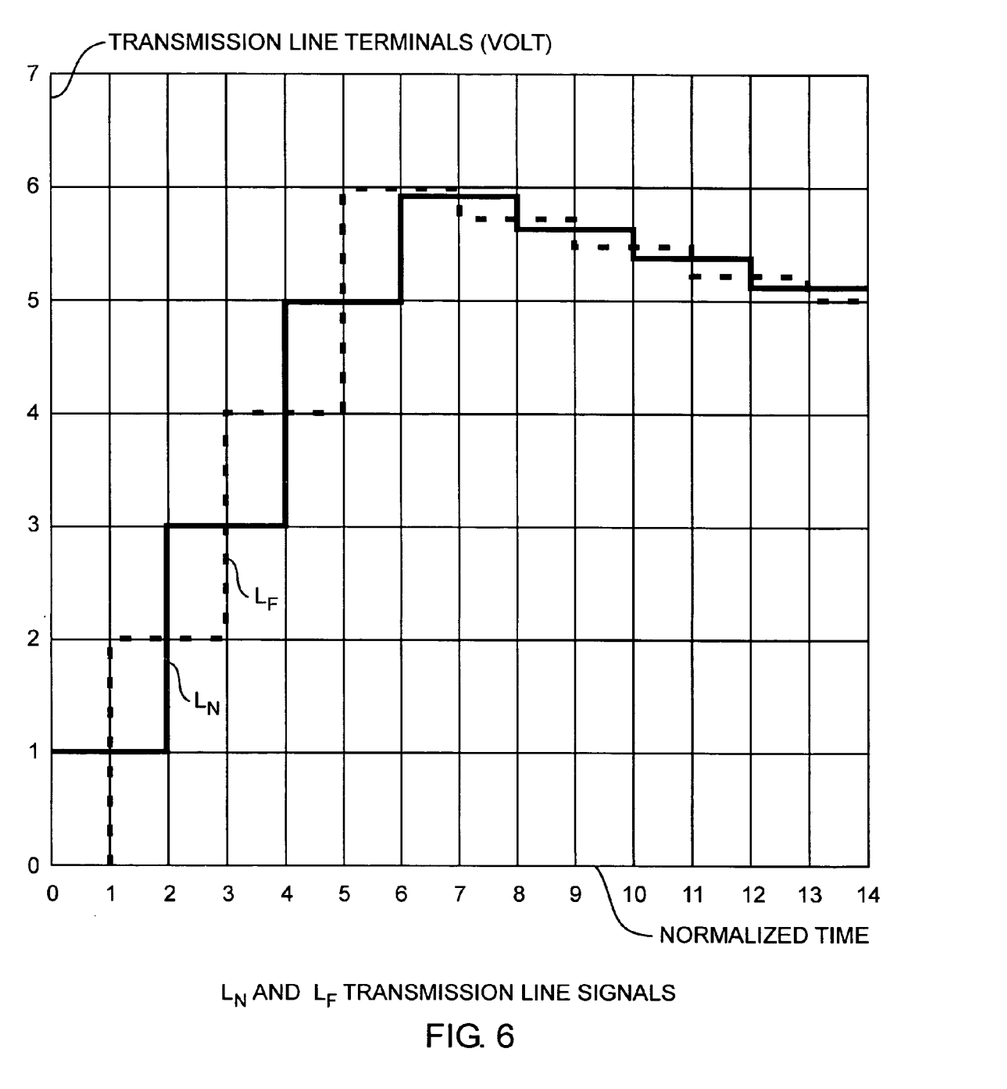
FIG. 6 is graph of $L_N$ and $L_F$ transmission line signals.

Referring to all of the Figures, and more particularly to FIGS. 5 and 6, a successive byte ADC has reduced circuit complexity and higher speed. An analog input 120 is fed into a sample and hold circuit 122. A trigger 123 is issued to the logic circuit 144 that generates an input sample signal to activate the sample and hold circuit 122 that feeds a sampled analog signal to a near comparator 124 and a far comparator 126. Next, the logic circuit 144 issues the first charge signal, which closes the switch $S_{IN1}$, applying current source $I_{IN1}$ to the near end of the transmission line 142. An $I_{IN1}$ current source 128 provides a positive $I_{IN1}$ current to start a most significant stair-stepping period consisting of the near stair-step signal $L_N$ fed to the near comparator 124, and far step signal $L_F$ fed to the far comparator 126. The near and far stair-step signals have interleaved stair-stepped waveforms. When the near stair-step signal exceeds the input sample and hold level that is present at the output of the sample and hold circuit 122, the near comparator 124 toggles at a near quantization time and issues a near quantization signal. When the far stair-step signal exceeds the input sample and hold level that is present at the output of sample and hold circuit 122, the far comparator 126 toggles at a far quantization time and issues a far quantization signal. Either one of the comparators 124 or 126 will toggle. When either of the near or far quantization signals from one of the comparators 124 and 126 is received by the logic circuit 144, the logic circuit ends the most significant stair-stepping period by deactivating the first charge signal that opens switch 134, ending the stair-stepping waveforms of the most significant stair-stepping period. At the same time the content of the counter 146 is loaded into the most significant byte of the two-byte register 150. One L/v time period later, the logic circuit 144 begins the residual stair-stepping period by issuing the second charge signal that closes switch $S_{IN2}$ 130 for applying negative current source $I_{IN2}$ 128 to the near end of the transmission line. The $I_{IN2}$ current source 128 has a magnitude that is a factor 2 smaller than the $I_{IN1}$ current source 132, and a polarity opposite that of the $I_{IN1}$ current source 132, so that the stair-step signal now begins to decrease during the residual sampling period in steps a factor $2^N$ smaller than during the most significant stair-stepping period. When the near stair-step $L_N$ signal drops below the sample and hold level that is present at the output of the sample and hold circuit 122, the near comparator 124 toggles off, ending the residual stair-stepping period. When the far stair-step signal $L_F$ drops below the sample and hold level that is present at the output of the sample and hold circuit, 122, the far comparator 126 toggles off, ending the residual stair-stepping period. Either one of the comparators 124 or 126 will toggle off. When either the near or far comparators 124 or 126 toggles off, the logic circuit 144 ends the residual stair-stepping period by deactivating the second charge signal, opening switch $S_{IN2}$, removing the current source $I_{IN2}$ from the transmission line. At the same time the content of the counter 146 is loaded into the least significant byte of the two-byte register 150, which then becomes the conversion digital output 152. Next, the logic circuit issues the discharge signal that closes switches $S_N$ 140 and $S_F$ 146 at the near and far ends of the transmission line. The $S_F$ and $S_N$ switches 140 and 146 function to discharge the transmission line 142 at the end of residual stair-stepping period at the end of the conversion cycle. Lastly, the reset signal 136 is issued to clear the counter, and start the process over again for the next analog-to-digital conversion.

The two $I_{IN1}$ and $I_{IN2}$ current sources 128 and 132 are independently switched onto the near terminal of the transmission line 142. The $I_{IN1}$ current source 132 is switched in during the significant stair-stepping period upon issuance of the first charge signal from the logic circuit 144 for providing $I_{IN1}$ current to the transmission line 142. The $I_{IN2}$ current source 128 is switched in during the residual stair-stepping period upon issuance of the second charge signal from the logic circuit 144 for providing a negative $I_{IN2}$ current to the transmission line 142. In so doing, the near and far stair-step signals increase in $V_0$ steps during the significant stair-step period for digitizing the MSB, and the near and far stair-step signal decrease in $V_0/(2^N)$ steps during the residual stair-stepping period for digitizing the LSB. A counter 146 is clocked by a clock 148 having an L/v time period. The counter 146 is latched at the end of significant and residual stair-stepping periods for respectively generating the MSB and LSB that are presented to a two-byte register 150 for providing the digital output 152.

The near and far comparators 124 and 126 toggle at first and second quantization times for respectively presenting first and second quantization signals to a logic circuit 144. The logic circuit 144 receives the trigger 123 and a reset 136 for generating the first charge, second charge, and discharge signals using conventional combinatory logic. The logic circuit 144 also stores digitization counter values from the counter 146 that is incremented using the clock 148 and reset by the reset 136. The logic circuit 144 presents MSB and LSB to a two-byte register 150 for presenting a digital output 152 that is the digitization of the sample analog signal from the sample and hold circuit 122.

In operation, the conversion cycle includes a most significant stair-stepping period and a residual stair-stepping period for generating the MSB and the LSB. The current source $I_{IN1}$ 132 is switched in first during the most significant stair-stepping period. The conversion digitizes the N-bit MSB during the most significant stair-stepping period, requiring at least one clock cycle and at most N clock cycles, where each cycle has a period of L/v. One clock cycle later current source $I_{IN1}$ 132 is switched out by opening the $S_{IN1}$ switch 134. Then, the $I_{IN2}$ current source 128 is switched in by closing the $S_{IN2}$ switch 130 during the residual stair-stepping period for digitizing the N-bit LSB. The $I_{IN2}$ current source 128 has a magnitude of $I_{IN1}/(2^N)$ where N is the number of bits in both the MSB and LSB. The polarity of the second current source $I_{IN2}$ 128 is opposite of the $I_{IN1}$ current source 132, such that, the near and far stair-step signal increment by $V_0$ during the significant stair-stepping period, and such that, the near and far stair-step signal decrement by $-V_0/(2^N)$ during the residual stair-stepping period. When the MSB digitization is complete, the additional clock cycle raises the transmission line voltage at the appropriate near or far end by one additional $V_0$ increment. The second current source then discharges the transmission line 142 in steps of $-V_0/(2^N)$ during the residual stair-stepping period, requiring additionally at least one clock cycle and at most N clock cycles.

By way of example, referring to FIG. 6 in which the time has been normalized to units of L/v, the number of bits N in the MSB and LSB is each 3, and the sampled analog signal is $5.5V_0$, so that the far comparator 126, that samples the far terminal of the transmission line $L_F$ 142, toggles first at time 5L/v. One clock cycle later, at cycle L/v=6, the near comparator 124 then toggles so that both the first and second comparators 124 and 126 indicate first and second quantizations. At the sixth cycle 6L/v, the current source $I_{IN}$ 132 is switched out and the current source $I_{IN2}$ 128 is switched in causing the net current to change from $I_{IN}$ to $-I_{IN}/8$, and now the near and far stair-step signals are descending stair-steps signals in $-V_0/8$ decrements. Eventually, one of the first and second comparators 124 and 126 will toggle back off again when the near and far stair-step signals decrease below the sampled analog signal of $5.5V_0$. By counting the L/v clock cycles from the sixth cycle 6L/v, allows the residual to be digitized by loading the counter value into the logic circuit 144. From the residual, the LSB can be presented to the two-byte output register 150. Then the transmission line 142 is then discharged upon the reset 136 and through the resistors 138 and 144 and through the respective switches 140 and 146. After discharge, the conversion may begin again.

The transmission line ADC can operate at high conversion speeds. Fast gallium-arsenide and indium-phosphide heterojunction bipolar transistor technologies can be used with clock frequencies beyond 40.0 GHz. A high quality transmission line can be implemented in these technologies, which are essentially microwave integrated circuits. Therefore, the transmission line characteristic time L/v could be designed for 25.0 ps. Then five bits could be decoded in $2^5\times 25$ ps=800 ps using the double conversion ADC. This is a worst-case maximum conversion time assuming that the analog signal is at its maximum level. On average, the conversion time will be half of this time when rounded up to the next cycle, or 425 ps. Allowing two more cycles for overhead for discharging the line and obtaining the next sample, the conversion period is 475 ps, or the average conversion rate is 2.105 Gsamples/sec for a five-bit sample. The successive multiplexed ADC can operate at high speeds as well. With N=5, the ADC would require an average time of 425 ps for the initial five-bit conversion, one additional cycle to raise the transmission line by an additional $V_0$ increment, an average time of 425 ps for the five-bit residue conversion, and two more overhead cycles. Therefore, a total average time of 925 ps per conversion is required, giving a conversion rate of 1.08 Gsamples/sec for a ten-bit sample. These ADC can be realizable with advanced monolithic microwave integrated circuit processes. An additional benefit is the low transistor count, and accompanied low power consumption.

The present invention is directed to an analog to digital converter having a transmission line for generating a stair-step signal to which a sampled analog signal is compared for determining the number of steps and hence the amount of time an hence the analog value in digital form. Preferably, current sources are used to drive the transmission line to generate the stair-step signals and resistors are used to discharge the transmission line for resetting the transmission line for converting another analog signal. The transmission line is relatively impervious to radiation and temperature effects. The transmission line of a desired physical length determines the circuit timing, and is free of jitter for fast precise operation. The preferred forms of the invention use one or two-bytes of digitization respectively using one or two stair-stepping periods. As is now apparent, any number of stair-stepping periods and bytes of digitization can be used. Those skilled in the art can make enhancements, improvements, and modifications to the invention, and these enhancements, improvements, and modifications may nonetheless fall within the spirit and scope of the following claims.

What is claimed is:

1. A converter for converting an input analog signal into a digital value, the converter comprising,
   a sample and hold circuit for sampling and holding the input analog signal and for providing a sampled analog signal,
   a comparator for comparing the sampled analog signal to a stair-step signal during a stair-stepping period and for generating a quantization signal at the end of the stair-stepping period when the sampled analog signal is equal to the stair-step signal,
   a transmission line for generating the stair-step signal by reflections from opposing near and far ends of the transmission line, each step of the stair-step signal having a step period, the stair-step signal generated during the stair-stepping period,
   a current source for driving the transmission line for generating the reflections, and
   a logic circuit for receiving the quantization signal and for time measuring the stair-stepping period as the digital value.

2. The converter of claim 1 wherein,
   the transmission line has a length L,
   the reflections have a velocity of v through the transmission line,
   the step period is equal to L/v,
   the stair-step signal increments in voltage level every step period during the stair-stepping period, and
   the digital value is equal to a number of increments of the stair-step signal.

3. The converter of claim 1 wherein,
   the transmission line has a length L,
   the reflections have a velocity of v through the transmission line,
   the step period is equal to L/v, and
   the digital value is equal to the stair-stepping period divided by the step period.

4. The converter of claim 1 further comprising,
   a discharge switch connected to the transmission line for discharging the transmission line after the stair-stepping period.

5. The logic circuit of claim 1 comprises,
a clock for generating a clock signal at the step period, and
a counter clocked by the clock for counting the number of step periods during the stair-stepping period for generating the digital value.

6. A converter for converting an analog input into a digital value, the converter comprising,
a sample and hold circuit for sampling and holding the input analog signal and for providing a sampled analog signal,
comparators for comparing the sampled analog signal to far and near stair-step signals during a stair-stepping period and for generating respective quantization signals,
a transmission line for generating the far and near stair-step signals by reflections from opposing near and far ends of the transmission line, each step of the stair-step signals having a step period, the stair-step signals generated during the stair-stepping period,
a current source for driving the transmission line for generating the reflections, and
a logic circuit for time measuring the stair-stepping period as the digital value.

7. The converter of claim 5 wherein,
the quantization signals are two quantization signals, and
the comparators are two comparators respectively comparing the near and far stair-step signals to the sampled analog signal for respectively generating the two quantization signals.

8. The converter of claim 7 further comprising,
discharge switches connected to the far and near ends of the transmission line for discharging the transmission line after the stair-stepping period.

9. A converter for converting an analog input into a digital value, the converter comprising,
a sample and hold circuit for sampling and holding the input analog signal and for providing a sampled analog signal,
comparators for comparing the sampled analog signal to far and near stair-step signals during stair-stepping periods and for generating respective quantization signals,
a transmission line for generating the far and near stair-step signals by reflections from opposing near and far ends of the transmission line, each step of the stair-step signals having a step period, the stair-step signals generated during the respective stair-stepping periods,
a current source for driving the transmission line for generating the reflections, and
a logic circuit for time measuring the stair-stepping periods as a digital value of the sampled analog input and for providing the digital value.

10. The converter of claim 9 wherein,
the quantization signals are two quantization signals, and
the comparators are near and far comparators respectively comparing the near and far stair-step signals to the sampled analog signal for respectively generating the near and far quantization signals.

11. The converter of claim 9 further comprising,
discharge switches connected to the far and near ends of the transmission line for discharging the transmission line after the stair-stepping periods.

12. The converter of claim 9 wherein
the quantization signals are near and far quantization signals,
the comparators are near and far comparators respectively comparing the near and far stair-step signals to the sampled analog signal for respectively generating the near and far quantization signals,
the stair-stepping periods are a significant stair-stepping period and a residual stair-stepping period, and
the current source provides a significant current during significant stair-stepping period and a residual stair-stepping current during the residual stair-stepping period.

13. The converter of claim 9 wherein
the quantization signals are near and far quantization signals,
the comparators are two comparators respectively comparing the near and far stair-step signals to the sampled analog signal for respectively generating the near and far quantization signals,
the stair-stepping periods are a significant stair-stepping period and a residual stair-stepping period,
the current source provides a significant current I during significant stair-stepping period and a residual stair-stepping current $I/(2^N)$ during the residual stair-stepping period,
the near and far stair-step signals are interleaved and increment by V during the significant stair-stepping period,
the near and far stair-step signals are interleaved and decrement by $V/(2^N)$ during the residual stair-stepping period, and
the comparators provide quantization signals when either of the near or far stair-step signal is equal to the sampled analog signal at the end of the stair-stepping periods.

14. The converter of claim 13 further comprising,
a counter having N bits for time measuring the significant stair-stepping period as a significant byte and for time measuring the residual stair stepping period as a residual byte, and
the digital value is a two-byte word of the significant byte and residual byte.

15. A converter for converting an analog input into a digital value, the converter comprising,
a sample and hold circuit for sampling and holding the input analog signal and for providing a sampled analog signal,
a residual circuit for generating and sampling a residual,
a multiplexer for selecting the sampled analog signal or the residual as a multiplexed analog signal,
near and far comparators for respectively comparing the multiplexed analog signal to far and near stair-step signals during a significant stair-stepping period and a residual stair-stepping period and for generating respective near and far quantization signals, the residual being a difference between sampled analog signal and one of the near or far stair-stepping signal at either the near and far quantization signals,
a transmission line for generating the far and near stair-step signals by reflections from opposing near and far ends of the transmission line, each step of the stair-step signals having a step period, the significant and residual stair-step signals generated during the respective significant and residual stair-stepping periods,
a current source for driving the transmission line for generating the reflections, and
a logic circuit for time measuring the significant and residual stair-stepping periods as the digital value.

16. The converter of claim 15 further comprising,
discharging switches for discharging the transmission line after providing the digital value.

17. The converter of claim 15 wherein the residual circuit comprises,
  near and far sample and hold circuits for respectively providing near and far residuals, the residual being either the near residual or the far residual, and
  near and far amplifiers of gain $2^N$ for generating the near and far residuals, the residual being the near residual proportional to a difference between the sampled analog signal and the near stair-step signal when the near comparator generates the near quantization signal, the residual being the far residual proportional to a different between the sampled analog signal and the far stair-step signal when the far comparator generates the far quantization signal.

18. The converter of claim 17 wherein,
  the digital value is a significant byte of N bits and a residual byte of N bits.

19. The converter of claim 17 wherein,
  the near and far amplifiers have a gain of $2^N$.

* * * * *